(12) United States Patent  (10) Patent No.: US 7,602,259 B2
Matsuzuka et al.  (45) Date of Patent: Oct. 13, 2009

(54) VOLTAGE-CONTROLLED OSCILLATOR

(75) Inventors: Takayuki Matsuzuka, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 77 days.

(21) Appl. No.: 11/936,142

(22) Filed: Nov. 7, 2007

(65) Prior Publication Data

US 2008/0238562 A1  Oct. 2, 2008

(30) Foreign Application Priority Data

Mar. 30, 2007 (JP) ............................. 2007-093698

(51) Int. Cl.
*H03L 1/00* (2006.01)
(52) U.S. Cl. .................... 331/176; 331/16; 331/17; 331/66; 331/69; 331/70; 331/117 R; 331/117 FE; 331/117 D; 331/175; 331/167; 331/177 R; 331/177 V
(58) Field of Classification Search ............ 331/16, 331/17, 66, 69, 70, 117 R, 117 FE, 117 D, 331/175, 176, 177 R, 177 V, 167
See application file for complete search history.

(56) References Cited

U.S. PATENT DOCUMENTS

| 4,096,452 | A | * | 6/1978 | Waku et al. ............. 331/116 R |
| 4,254,382 | A | * | 3/1981 | Keller et al. ............. 331/116 R |
| 4,607,237 | A | * | 8/1986 | Aota ....................... 331/116 R |
| 4,751,475 | A | * | 6/1988 | Kubo et al. .............. 331/117 D |
| 7,049,899 | B2 | * | 5/2006 | Kato .......................... 331/176 |
| 7,177,612 | B2 | | 2/2007 | Nakamura et al. |
| 2007/0126520 | A1 | | 6/2007 | Matsuzuka |

FOREIGN PATENT DOCUMENTS

JP  2005-102148  4/2005
JP  2007-158481  6/2007

* cited by examiner

*Primary Examiner*—Arnold Kinkead
*Assistant Examiner*—Richard Tan
(74) *Attorney, Agent, or Firm*—Leydig, Voit & Mayer, Ltd.

(57) ABSTRACT

A voltage-controlled oscillator has an oscillation frequency controlled through a voltage applied across ends of a variable-capacitance element. The voltage-controlled oscillator has a frequency control bias circuit which applies to a first end of the variable-capacitance element a voltage for frequency control according to a control voltage, a first current source which generates a first current according to the control voltage, a second current source which generates a second current according to temperature, independent of the control voltage, a converting resistor which converts a current, obtained by adding together the first and second currents, into a voltage, and a temperature compensation bias circuit which applies to the second end of the variable-capacitance element a voltage for temperature compensation according to the voltage produced by the converting resistor.

6 Claims, 10 Drawing Sheets

VOLTAGE-CONTROLLED OSCILLATOR

BACKGROUND OF THE INVENTION

1. Field of the Invention

The present invention relates generally to voltage-controlled oscillators operating mainly in a microwave or milliwave region and, more particularly, to a voltage-controlled oscillator capable of temperature compensation in a wide range of oscillation frequencies.

2. Background Art

A voltage-controlled oscillator whose oscillation frequency is controlled according to a voltage applied to the base of a transistor is being used. As such a voltage-controlled oscillator, one devised to obtain the same oscillation frequency at different temperatures has been proposed (see, for example, Japanese Patent Laid-Open No. 2005-102148).

FIG. 14 is a circuit diagram showing an example of a conventional voltage-controlled oscillator. An inductor 12 for series feedback is provided between the emitter of a bipolar transistor 11 and a grounding point. An output matching circuit 14 is provided between the collector of the bipolar transistor 11 and an output terminal 13. One end of a phase adjusting line 15 for satisfying a phase condition for starting oscillation is connected to the base of the bipolar transistor 11.

An inductor 16 and a variable-capacitance element 17 are connected in series between the other end of the phase adjusting line 15 and a grounding point. The inductor 16 and the variable-capacitance element 17 constitute an LC series resonance circuit. A frequency control bias circuit 21 applies to one end of the variable-capacitance element 17 a voltage for frequency control according to a control voltage input through a terminal 22.

In this voltage-controlled oscillator, the voltage applied to one end of the variable-capacitance element 17 is controlled with respect to temperature to control the oscillation frequency. In this way, variation in the oscillation frequency with temperature is corrected.

FIG. 15 is a diagram schematically showing oscillation frequency characteristics of the conventional voltage-controlled oscillator. For example, in a case where a voltage at a point A is applied to the two ends of the variable-capacitance element 17 at ordinary temperature, a voltage at a point B may be applied when a higher temperature is reached and a voltage at a point C may be applied when a lower temperature is reached, thus enabling the same oscillation frequency to be obtained at each temperature. In the voltage-controlled oscillator shown in FIG. 14, however, correction of the oscillation frequency with respect to temperature and frequency control at the same temperature are performed through the voltage applied to the same terminal and, therefore, complicated voltage control is required.

FIG. 16 is a circuit diagram showing another conventional voltage-controlled oscillator. A direct current blocking capacitor 18 is provided between a variable-capacitance element 17 and a grounding point. A temperature compensation bias circuit 23 applies to the other end of the variable-capacitance element 17 a voltage for temperature compensation according to a voltage generated by a temperature compensation bias generation circuit 24. In other respects, the configuration shown in FIG. 16 is the same as that of the voltage-controlled oscillator shown in FIG. 15.

The temperature compensation bias generation circuit 24 has a transistor 51, resistors 52 to 54 and terminals 55 and 56. A fixed voltage is applied from the terminal 55 to the collector of the transistor 51 through the resistor 52. A fixed voltage is applied from the terminal 56 to the base through the resistor 53. The emitter is grounded through the resistor 54. A voltage is output from the collector of the transistor 51 to the temperature compensation bias circuit 23.

FIG. 17 is a diagram schematically showing a characteristic of the voltage at a point X in FIG. 16 with respect to temperature. FIG. 18 is a diagram schematically showing a characteristic of the voltage between the two ends of the variable-capacitance element shown in FIG. 16. When the temperature rises, the collector current of the transistor 51 increases, the amount of voltage drop across the resistor 52 becomes larger and the voltage at point X becomes lower. When the voltage at the other end of the variable-capacitance element 17 is higher than the voltage at point X, the voltage applied between the two ends of the variable-capacitance element 17 increases and the oscillation frequency becomes higher. Accordingly, while the oscillation frequency of ordinary voltage-controlled oscillators becomes lower with increasing temperature, the voltage-controlled oscillator shown in FIG. 17 is capable of compensating for a reduction in oscillation frequency due to an increase in temperature. That is, the voltage applied to the variable-capacitance element can be automatically controlled so that a signal is output at the same frequency even when the temperature changes. Also, since the terminal 22 used for frequency control and the terminals 55 and 56 used for temperature compensation are separated from each other, there is no need for complicated voltage application with respect to temperature. In the voltage-controlled oscillator shown in FIG. 16, therefore, temperature control such as that in the voltage-controlled oscillator shown in FIG. 14 can be omitted or simplified.

For example, the signal frequency of on-vehicle radars is 76 to 77 GHz. Accordingly, the output frequency of voltage-controlled oscillators of on-vehicle radars is ordinarily ⅛ or more of 76 to 77 GHz. There is a tendency to increase the output frequency for the purpose of simplifying the system. In a voltage-controlled oscillator operating at such a high frequency, the influence of the assembly accuracy on the characteristics is large. It is, therefore, desirable from the view point of productivity that the voltage-controlled oscillator be provided in monolithic (MMIC) form. In the case of providing the voltage-controlled oscillator in MMIC form, a variable-capacitance diode (varactor diode) using the base-collector or base-emitter capacitance of a transistor is used as the variable-capacitance element.

The capacitance-voltage characteristic of a varactor diode, however, is determined from the viewpoint of matching to the high-frequency characteristics of the transistor provided as an oscillating element and, therefore, cannot be optimized with respect to the linearity of the oscillation frequency. FIG. 19 shows oscillation frequency characteristics of the voltage-controlled oscillator shown in FIG. 16 in such a case. A certain voltage offset is made independently of the control voltage. Therefore the control voltage with which temperature compensation can be performed is limited to only one point (point Y in FIG. 19) and variation in the oscillation frequency with temperature remains after compensation on the lower- or higher-voltage side thereof. That is, the range of oscillation frequency in which temperature compensation can be performed is considerably narrow.

SUMMARY OF THE INVENTION

In view of the above-described problem, an object of the present invention is to provide a voltage-controlled oscillator capable of temperature compensation in a wide range of oscillation frequencies.

According to one aspect of the present invention, the oscillation frequency in a voltage-controlled oscillator is controlled through a voltage applied to two ends of a variable-capacitance element. The voltage-controlled oscillator comprises a frequency control bias circuit which applies to one end of the variable-capacitance element a voltage for frequency control according to a control voltage; a first current source which generates a first current according to the control voltage; a second current source which generates a second current according to temperature independently of the control voltage; a converting resistor which converts a current obtained by adding together the first and second currents into a voltage; and a temperature compensation bias circuit which applies to the other end of the variable-capacitance element a voltage for temperature compensation according to a voltage obtained by conversion by the converting resistor.

The present invention enables temperature compensation in a wide range of oscillation frequencies.

Other and further objects, features and advantages of the invention will appear more fully from the following description.

DETAILED DESCRIPTION OF THE PREFERRED EMBODIMENTS

First Embodiment

Figure 1:
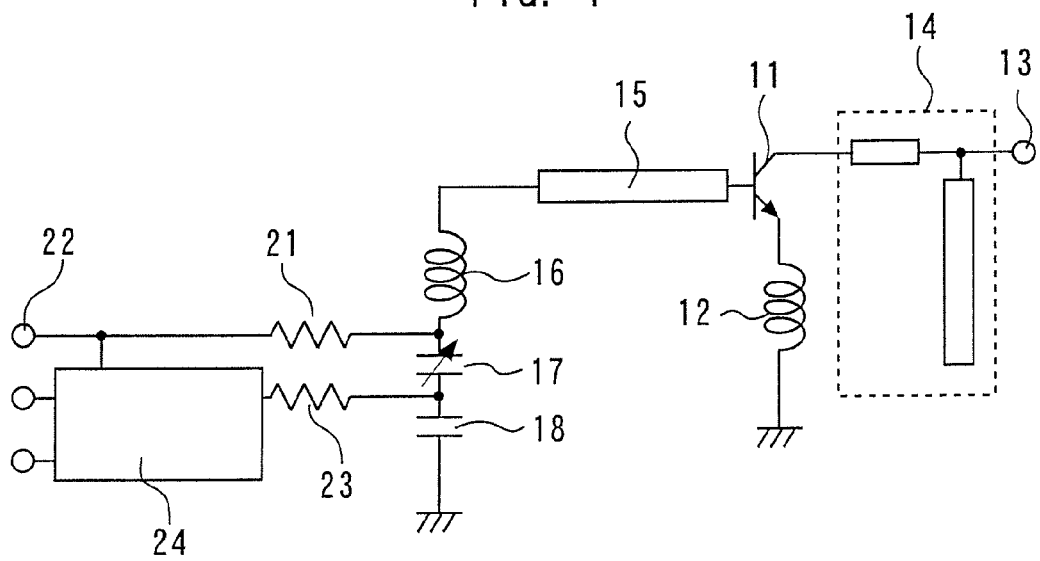
FIG. 1 is a circuit diagram showing a voltage-controlled oscillator according to the first embodiment of the present invention.

FIG. 1 is a circuit diagram showing a voltage-controlled oscillator according to the first embodiment of the present invention. An inductor 12 for series feedback is provided between the emitter of a bipolar transistor 11 and a grounding point. An output matching circuit 14 is provided between the collector of the bipolar transistor 11 and an output terminal 13. One end of a phase adjusting line 15 for satisfying a phase condition for starting oscillation is connected to the base of the bipolar transistor 11. An inductor 16 and a variable-capacitance element 17 are connected in series to the other end of the phase adjusting line 15. The inductor 16 and the variable-capacitance element 17 constitute an LC series resonance circuit. A direct current blocking capacitor 18 is provided between the variable-capacitance element 17 and a grounding point.

In this voltage-controlled oscillator, the oscillation frequency is controlled by a voltage applied between the two ends of the variable-capacitance element 17. That is, a resistance feed type of frequency control bias circuit 21 applies to one end of the variable-capacitance element 17 (a point of connection to the inductor 16) a voltage for frequency control according to a control voltage input through a terminal 22. Also, a feedback type of temperature compensation bias circuit 23 applies to the other end of the variable-capacitance element 17 a voltage for temperature compensation according to a voltage generated in a temperature compensation bias generation circuit 24.

Figure 2:
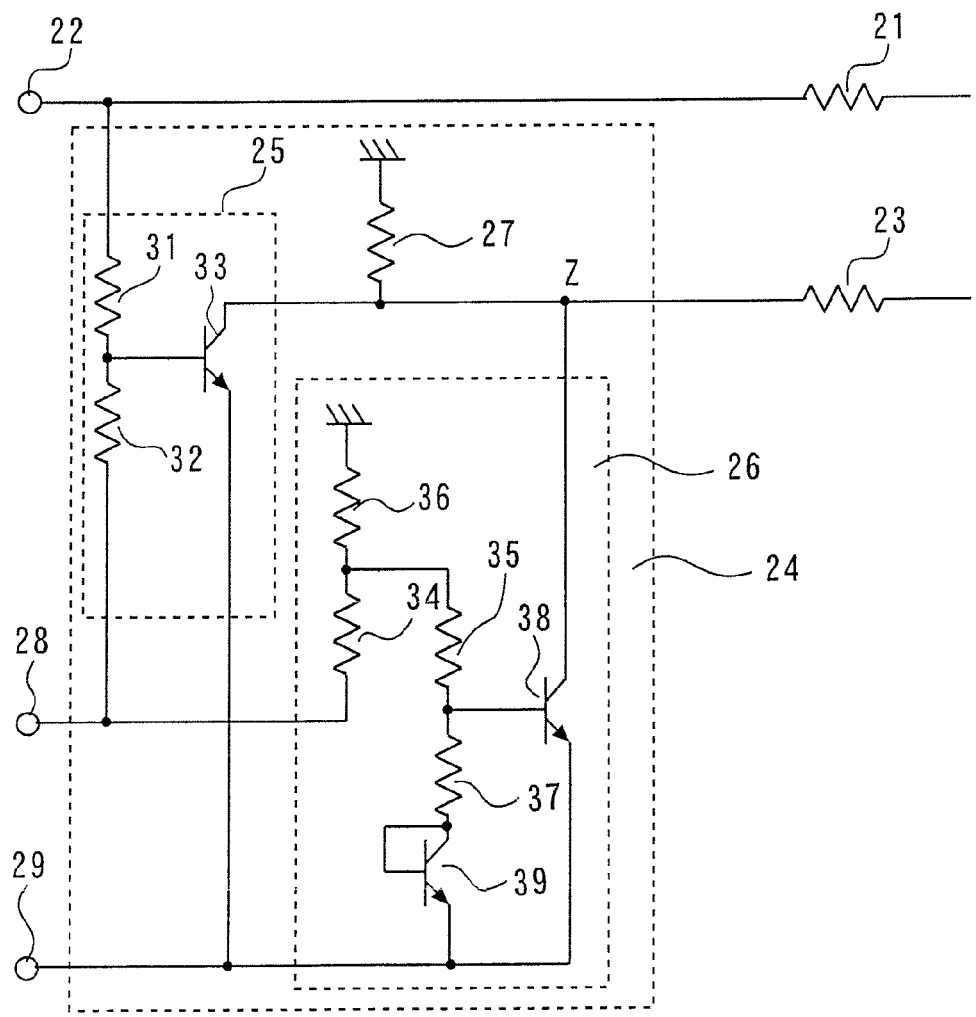
FIG. 2 is a circuit diagram showing the temperature compensation bias generation circuit according to the first embodiment of the present invention.

FIG. 2 is a circuit diagram showing the temperature compensation bias generation circuit 24 according to the first embodiment of the present invention. The temperature compensation bias generation circuit 24 has a first current source 25, a second current source 26, a converting resistor 27 and terminals 28 and 29. A first fixed voltage and a second fixed voltage are input from the outside through the terminals 28 and 29, respectively.

The first current source 25 has a resistor 31 (first resistor), a resistor 32 (second resistor) and a first bipolar transistor 33. A control voltage is applied to one end of the resistor 31. The first fixed voltage is applied to one end of the resistor 32. The other end of the resistor 32 is connected to the other end of the resistor 31. The first bipolar transistor 33 has a base thereof connected to a connection point between the resistor 31 and the resistor 32 and a collector thereof connected to the converting resistor 27. The second fixed voltage is applied to the emitter of the first bipolar transistor 33. The first current source 25 generates a first current according to the control voltage.

The second current source 26 has resistors 34 and 35 (third resistor), a resistor 36, a resistor 37 (fourth resistor), a second bipolar transistor 38 and a transistor 39. The first fixed voltage is applied to one end of the resistor 34. The resistor 36 is connected between the other end of the resistor 34 and a grounding point. One end of the resistor 35 is connected to the other end of the resistor 34. The second fixed voltage is applied to one end of the resistor 37 through the transistor 39. The other end of the resistor 37 is connected to the other end of the resistor 35. The second bipolar transistor 38 has a base thereof connected to a connection point between the resistor 35 and the resistor 37 and a collector thereof connected to the converting resistor 27. The second fixed voltage is applied to the emitter of the second bipolar transistor 38. The second current source 26 generates a second current according to temperature independently of the control voltage.

The first and second current sources 25 and 26 are connected in parallel to one end of the converting resistor 27. The other end of the converting resistor 27 is grounded. The converting resistor 27 converts the current obtained as the sum of the first and second currents into a voltage. This voltage is output to the temperature compensation bias circuit 23.

In the above-described arrangement, the collector currents of the first and second bipolar transistors 33 and 38 increase with increasing temperature. Accordingly, the voltage drop caused by the converting resistor 27 increases with increasing temperature. When the control voltage is higher than the voltage at point Z shown in FIG. 2, the voltage between the two ends of the variable-capacitance element 17 increasing with increasing temperature. Therefore, a reduction in oscillation frequency with an increase in temperature can be compensated for.

Figure 3:
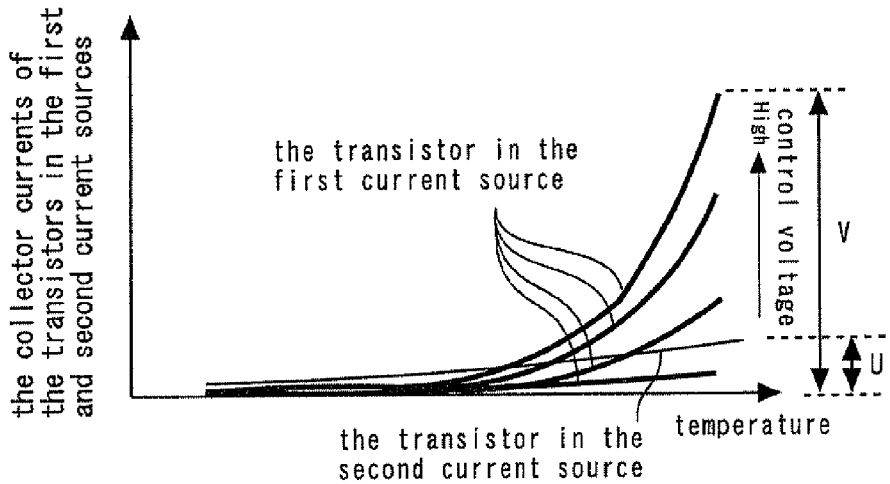
FIG. 3 is a diagram showing temperature dependences of the collector currents of the transistors in the first and second current sources in a case where the control voltage is changed to four values.

FIG. 3 is a diagram showing temperature dependences of the collector currents of the transistors in the first and second current sources in a case where the control voltage is changed to four values. As shown in FIG. 3, the collector current (second current) of the second bipolar transistor 38 of the second current source 26 has a generally constant gradient with respect to temperature independently of the control voltage. On the other hand, the collector current (first current) of the first bipolar transistor 33 of the first current source 25 depends on the magnitude of the control voltage and rises abruptly with increasing temperature.

Figure 4:
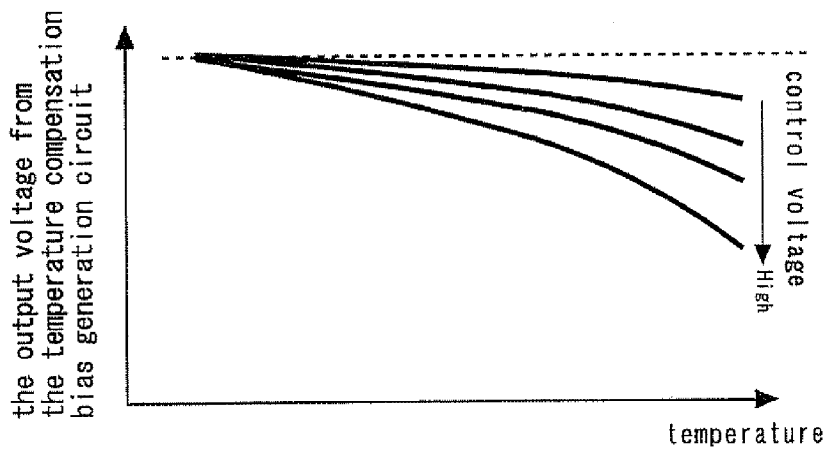
FIG. 4 is a diagram showing a temperature dependence of the output voltage from the temperature compensation bias generation circuit.

FIG. 4 is a diagram showing a temperature dependence of the output voltage from the temperature compensation bias generation circuit. The current obtained by adding together the first and second currents having the above-described characteristics is converted into a voltage to achieve a target voltage-temperature curve.

Figure 5:
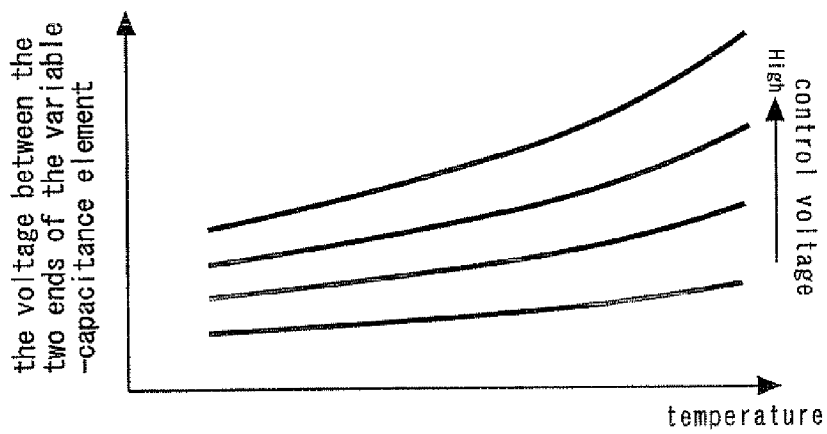
FIG. 5 is a diagram showing a temperature dependence of the voltage between the two ends of the variable-capacitance element shown in FIG. 1.

FIG. 5 is a diagram showing a temperature dependence of the voltage between the two ends of the variable-capacitance element shown in FIG. 1. As shown in FIG. 5, the voltage between the two ends of the variable-capacitance element is generally constant at each control voltage independently of temperature. Thus, according to the present embodiment, temperature compensation can be performed in a wide range of oscillation frequencies.

As the present embodiment, a series feedback type of voltage-controlled oscillator has been described in which a bipolar transistor 11 is used as an active element and one LC series resonance circuit is connected to the base of the bipolar transistor 11. The present invention, however, is not limited to any of a particular kind of active element, a particular kind, number and connection position of the resonance circuit. Accordingly, a field effect transistor (FET) may be used as an active element, and a plurality of resonance circuits may be connected to a terminal other than the base of the bipolar transistor 11. Also, the present invention can be applied to a parallel feedback type of voltage-controlled oscillator.

The variable-capacitance element 17 can be implemented, for example, by using a pn junction diode or a Schottky diode in an off state. In the present embodiment, bias circuits of a resistance feed type are used as the frequency control bias circuit 21 and the temperature compensation bias circuit 23. However, a ¼ wavelength short stub type or the like may be used, because the present invention is independent of the kinds of the bias circuits. The bias circuit for the bipolar transistor 11 is omitted for ease of description. While in the present embodiment the first and second bipolar transistors 33 and 38 are used as a device for generating a voltage for control with respect to changes in temperature, a FET having a temperature characteristic similar to that of the bipolar transistor 11 may alternatively be used.

The voltage-controlled oscillator according to the present embodiment can be made by forming a transmission line pattern on a ceramic substrate or the like and thereafter mounting circuit components. However, it is desirable that the voltage-controlled oscillator according to the present embodiment be integrally formed on a semiconductor substrate, i.e., in microwave monolithic IC (MMIC) form, for reasons described below.

Figure 6:
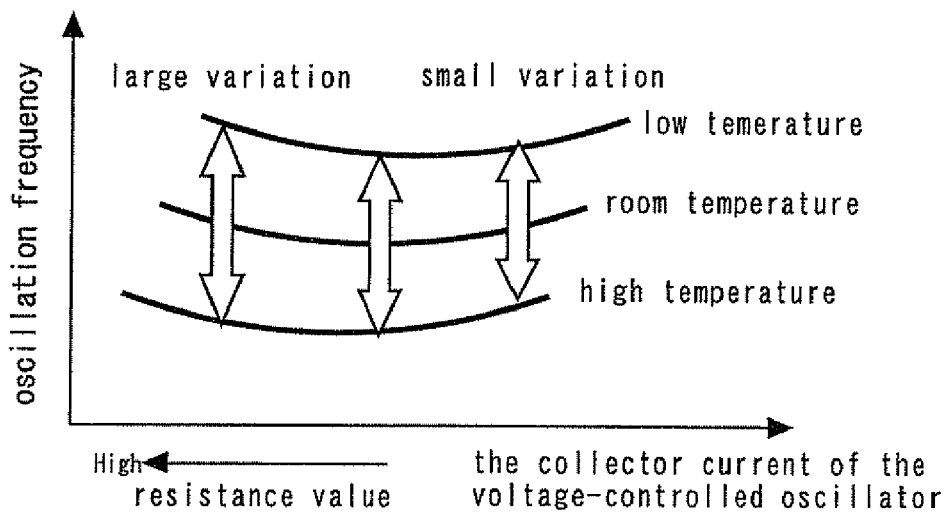
FIG. 6 is a diagram schematically showing the relationship between a collector current and variation in the oscillation frequency with respect to temperature in the voltage-controlled oscillator.
Figure 7:
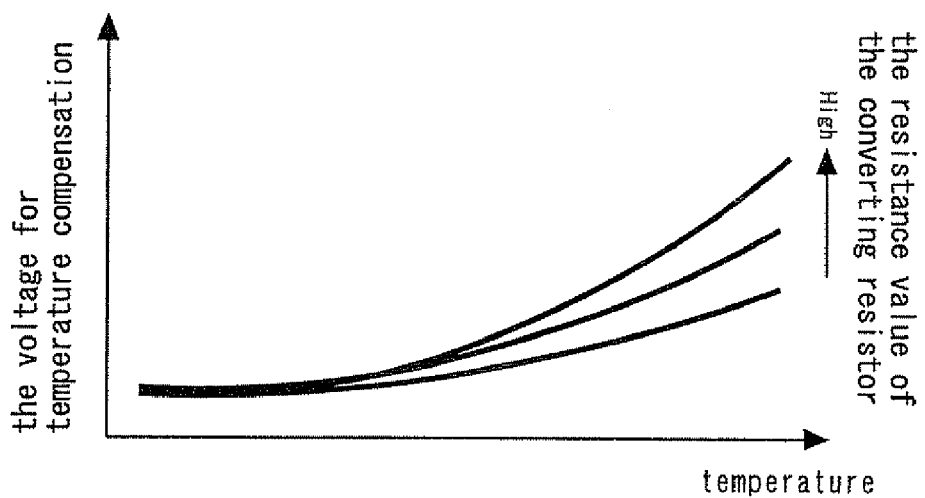
FIG. 7 is a diagram showing the relationship between a temperature dependence of the output voltage from the temperature compensation bias generation circuit and resistance values.

To stabilize the operation of the voltage-controlled oscillator by reducing variation in the collector current of the bipolar transistor 11 with temperature, a resistor may be inserted in series with the base or the emitter for feedback. However, the collector current varies due to manufacturing variation of the resistor. If the resistance value of the resistor is larger, variation in the oscillation frequency with respect to temperature is larger, as shown in FIG. 6. The output voltage (the voltage at point Z in FIG. 2) of the temperature compensation bias generation circuit 24 according to the present embodiment is determined mainly by the resistance value of the converting resistor 27. Therefore, if the resistance value of the converting resistor 27 is larger, the voltage for temperature compensation is increased and a larger variation with respect to temperature can be compensated for, as shown in FIG. 7. Accordingly, these resistors act in such directions as to cancel out, so that variation with respect to manufacturing variation of the resistors is reduced in the case of construction in MMIC form.

It can be predicted that in a case where the voltage-controlled oscillator according to the present embodiment is adapted to an application (e.g., on-vehicle radar) of which a low phase noise characteristic is required, the phase noise characteristic will be deteriorated by input of low-frequency noise generated in the temperature compensation bias generation circuit 24 to the variable-capacitance element 17. In such a case, a low-pass filter for eliminating low-frequency noise may be inserted between the temperature compensation bias generation circuit 24 and the temperature compensation bias circuit 23 to limit deterioration in the phase noise characteristic.

Second Embodiment

Figure 8:
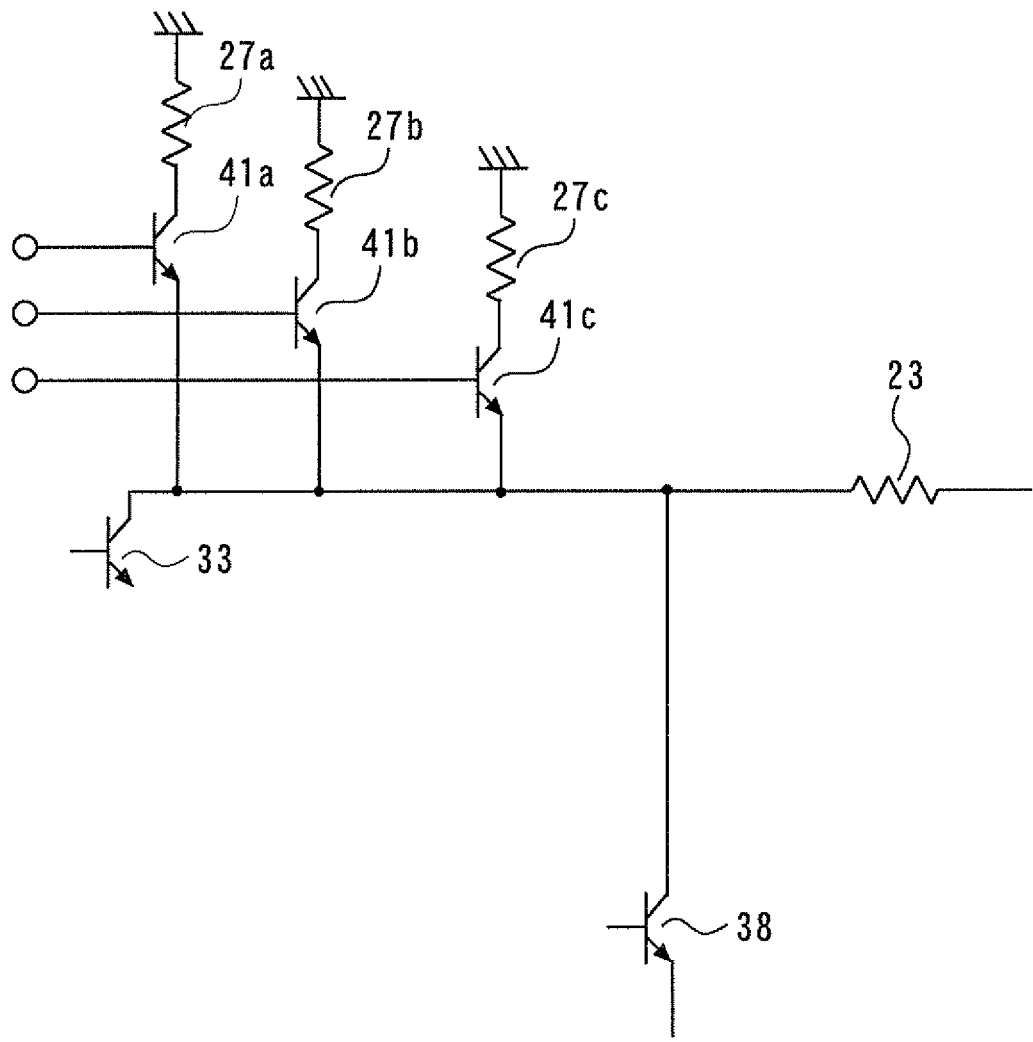
FIG. 8 is a circuit diagram showing a portion of a temperature compensation bias generation circuit according to the second embodiment of the present invention.

FIG. 8 is a circuit diagram showing a portion of a temperature compensation bias generation circuit according to the second embodiment of the present invention. While the converting resistor 27 is used in the first embodiment, converting resistors 27a to 27c and transistors 41a to 41c are used in this embodiment. In other respects, the configuration is the same as that in the first embodiment.

The collectors of the transistors 41a to 41c are respectively connected to ends of the converting resistors 27a to 27c. The other ends of the converting resistors 27a to 27c are grounded. The first and second current sources 25 and 26 are connected to the emitters of the transistors 41a to 41c. The transistors 41a to 41c select any one or more of the converting resistors 27a to 27c according to signals input to their bases from the outside. That is, the resistance value of the converting resistor is variable. In this way, the amount of temperature compensation can be controlled from the outside.

Third Embodiment

Figure 9:
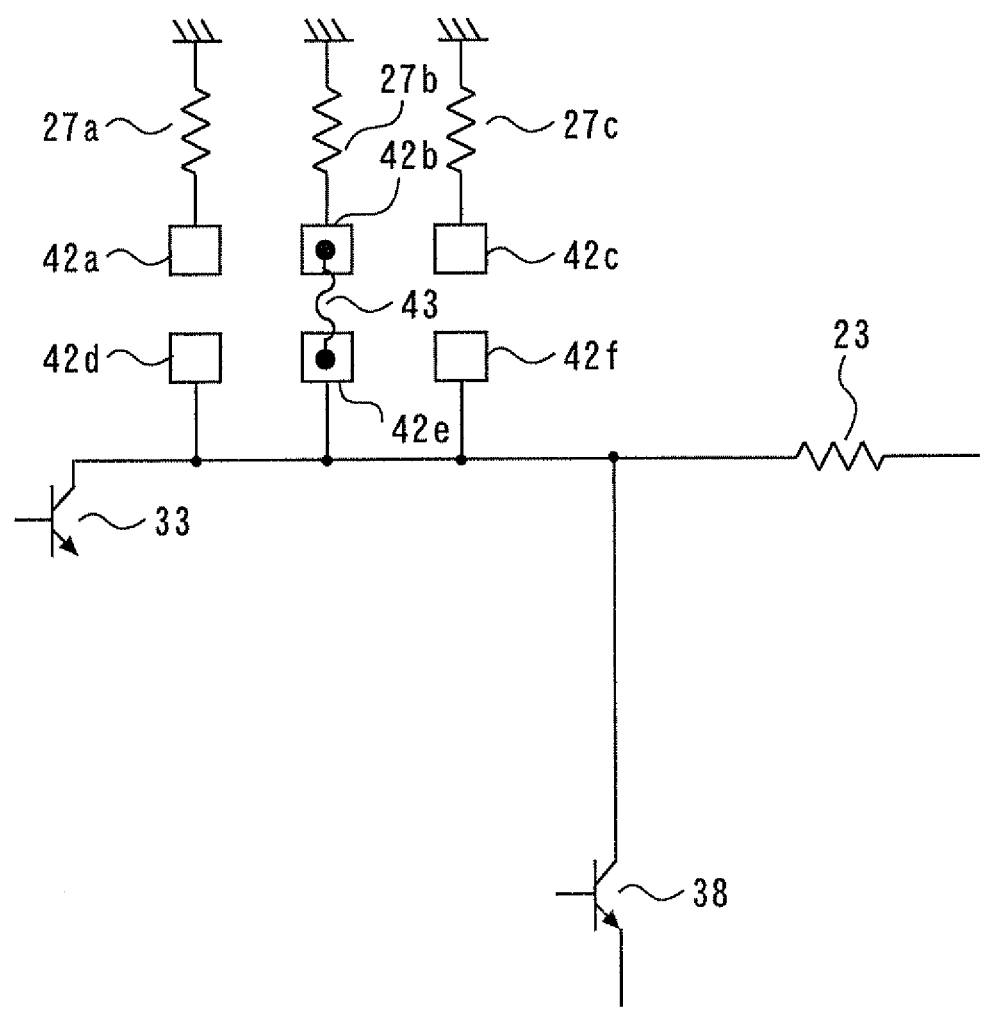
FIG. 9 is a circuit diagram showing a portion of a temperature compensation bias generation circuit according to the third embodiment of the present invention.

FIG. 9 is a circuit diagram showing a portion of a temperature compensation bias generation circuit according to the third embodiment of the present invention. While the converting resistor 27 is used in the first embodiment, converting resistors 27a to 27c and bonding pads 42a to 42f are used in this embodiment. In other respects, the configuration is the same as that in the first embodiment.

The bonding pads 42a to 42c are respectively connected to ends of the converting resistors 27a to 27c. The other ends of the converting resistors 27a to 27c are grounded. The first and second current sources 25 and 26 are connected to the bonding pads 42d to 42f. Any one of the bonding pads 42a to 42c is connected to the corresponding one of the conventional bonding pads 42d to 42f with a wire 43. In this way, the resistance value of the converting resistor is made variable. As a result, the same effect as that in the second embodiment is obtained.

Fourth Embodiment

Figure 10:
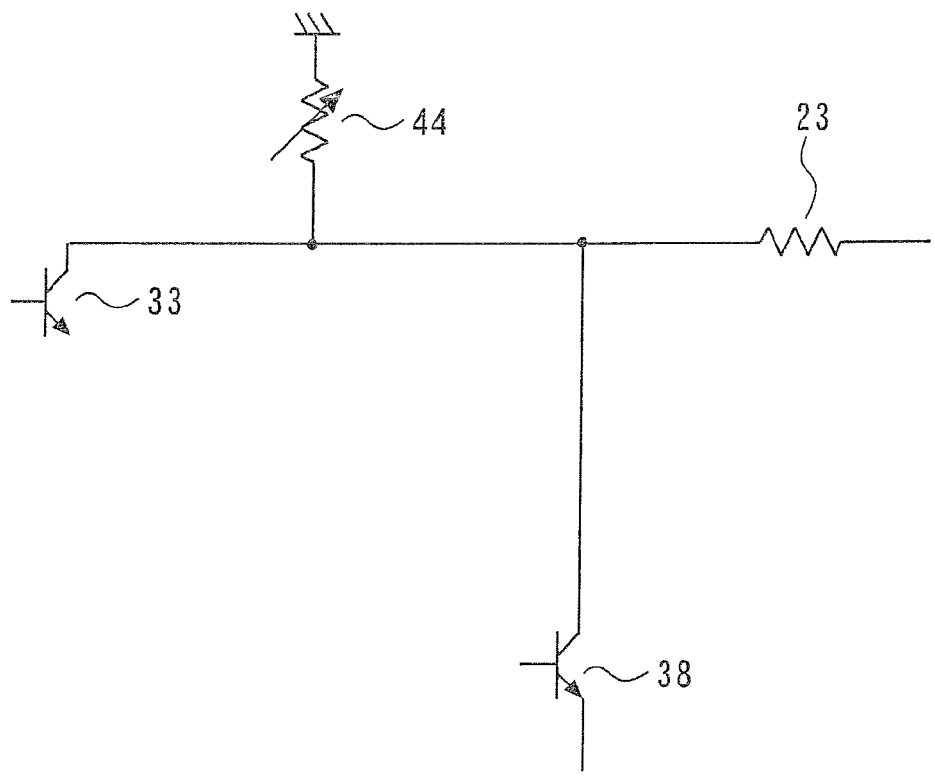
FIG. 10 is a circuit diagram showing a portion of a temperature compensation bias generation circuit according to the fourth embodiment of the present invention.

FIG. 10 is a circuit diagram showing a portion of a temperature compensation bias generation circuit according to the fourth embodiment of the present invention. While the converting resistor 27 is used in the first embodiment, a trimming resistor 44 is used in the fourth embodiment. In other respects, the configuration is the same as that in the first embodiment. The resistance value of the trimming resistor 44 can be changed by trimming. As a result, the same effect as that in the second embodiment is obtained.

Fifth Embodiment

Figure 11:
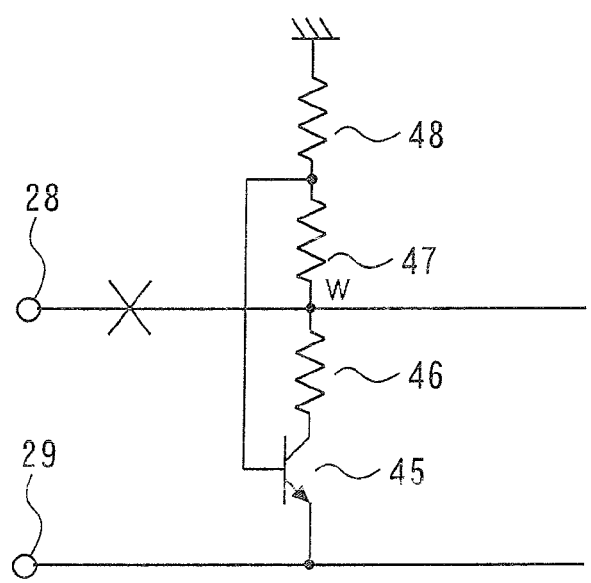
FIG. 11 is a circuit diagram showing a portion of a temperature compensation bias generation circuit according to the fifth embodiment of the present invention.

FIG. 11 is a circuit diagram showing a portion of a temperature compensation bias generation circuit according to the fifth embodiment of the present invention. This diagram is an extract of only a portion in the vicinity of terminals 28 and 29 to which fixed voltages are supplied from the outside.

A transistor 45 and resistors 46 to 48 are connected in series between the terminal 29 and a grounding point. The base of the transistor 45 is connected to a connection point between the resistor 47 and the resistor 48. The voltage at point W in FIG. 11 obtained by dividing the on voltage on the transistor 45 with the resistors 46 and 47 on the basis of the second fixed voltage input through the terminal 29 is set as the first fixed voltage.

In the first embodiment, the first and second fixed voltages are input from the outside. Therefore, if the first and second fixed voltages vary in opposite directions (for example, the first fixed voltage is high and the second fixed voltage is low), the operating conditions of the first and second bipolar transistors 33 and 38 are changed largely from the design values. In this embodiment, the first fixed voltage is generated in the circuit on the basis of the second fixed voltage applied from the outside and, therefore, the first fixed voltage varies in the same direction as the second fixed voltage. Therefore, the changes in the operating conditions of the first and second bipolar transistors 33 and 38 from the design values are comparatively small.

This embodiment has been described with respect to a case where the first fixed voltage is generated in the circuit on the basis of the second fixed voltage, the same effect is also obtained by determining the voltages in the reverse relationship. That is, one of the first and second fixed voltages is generated in the circuit on the basis of the other of the first and second fixed voltages. Therefore this embodiment ensures improved stability against variation in the externally applied voltage in comparison with the first embodiment.

Sixth Embodiment

Figure 12:
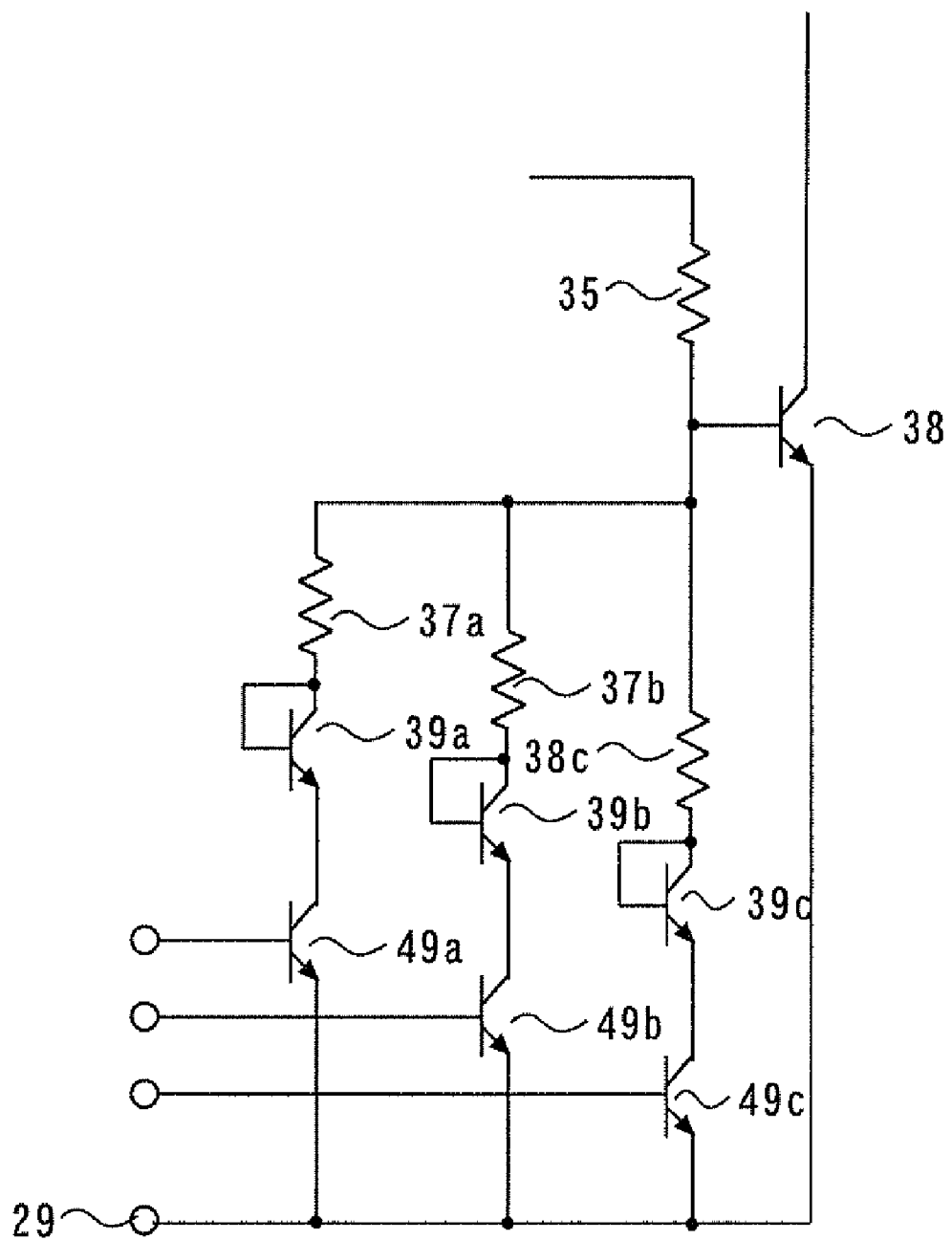
FIG. 12 is a circuit diagram showing a portion of a temperature compensation bias generation circuit according to the sixth embodiment of the present invention.

FIG. 12 is a circuit diagram showing a portion of a temperature compensation bias generation circuit according to the sixth embodiment of the present invention. While the resistor 37 and the transistor 39 are used in the second current source 26 in the first embodiment, resistors 37a to 37c and transistors 39a to 39c, and 49a to 49c are used in this embodiment. In other respects, the configuration is the same as that in the first embodiment.

The transistors 49a and 39a and the resistor 37a are connected in series between the terminal 29 to which the second fixed voltage is applied and the base of the second bipolar transistor 38. The transistors 49a and 39b and the resistor 37b, the transistors 49c and 39c and the resistor 37c are connected in parallel with the transistors 49a and 39a and the resistor 37a. The transistors 49a to 49c select any one or more of the resistors 37a to 37c according to signals respectively input to their bases from the outside. That is, the resistance value of the fourth resistor is variable.

The second current generated by the second current source 26 has a generally constant gradient with respect to temperature independently of the control voltage. In the first embodiment, this gradient is roughly determined by the resistance value of the resistor 37 (fourth resistor) shown in FIG. 2. In this embodiment, the resistance value of the fourth resistor is variable and, therefore, the magnitude of the second current can be controlled from the outside and the amount of temperature compensation can be controlled from the outside.

Seventh Embodiment

In the seventh embodiment, semiconductor resistors are used as the resistors 31, 35, and 36 shown in FIG. 2, and metal thin film resistors are used as the other resistors. In other respects, the configuration is the same as that in the first embodiment.

Figure 13:
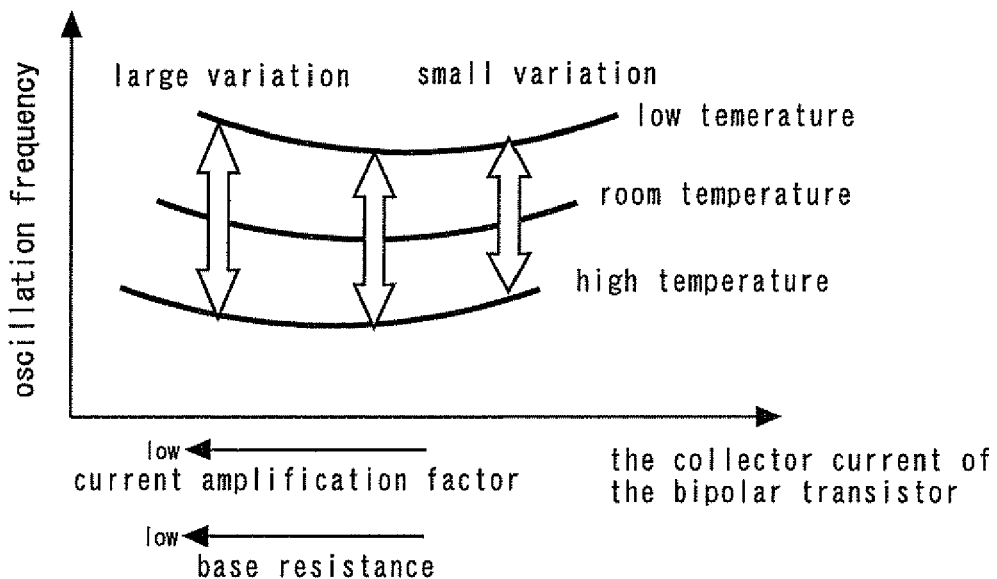
FIG. 13 is a diagram showing the relationship among the oscillation frequency of the voltage-controlled oscillator and the collector current, the current amplification factor and the base resistance of the transistor.
Figure 14:
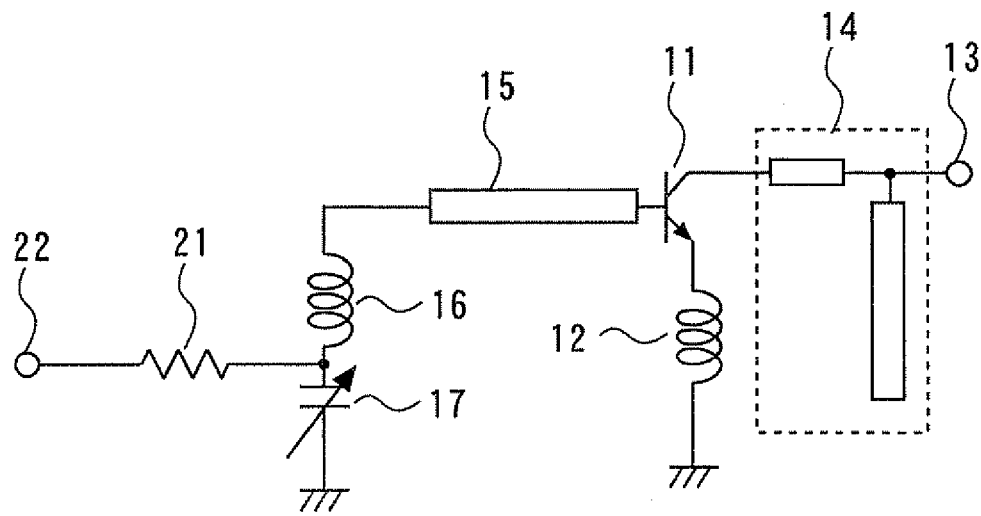
FIG. 14 is a circuit diagram showing an example of a conventional voltage-controlled oscillator.
Figure 15:
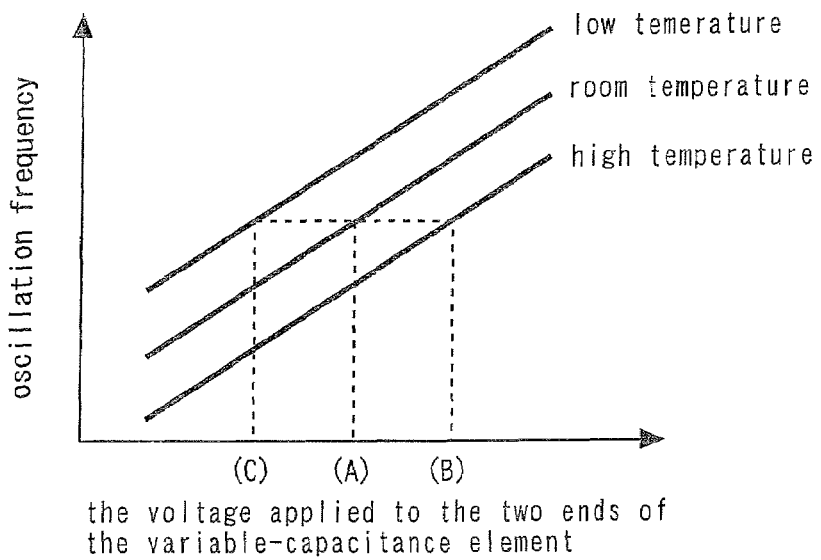
FIG. 15 is a diagram schematically showing oscillation frequency characteristics of the conventional voltage-controlled oscillator.
Figure 16:
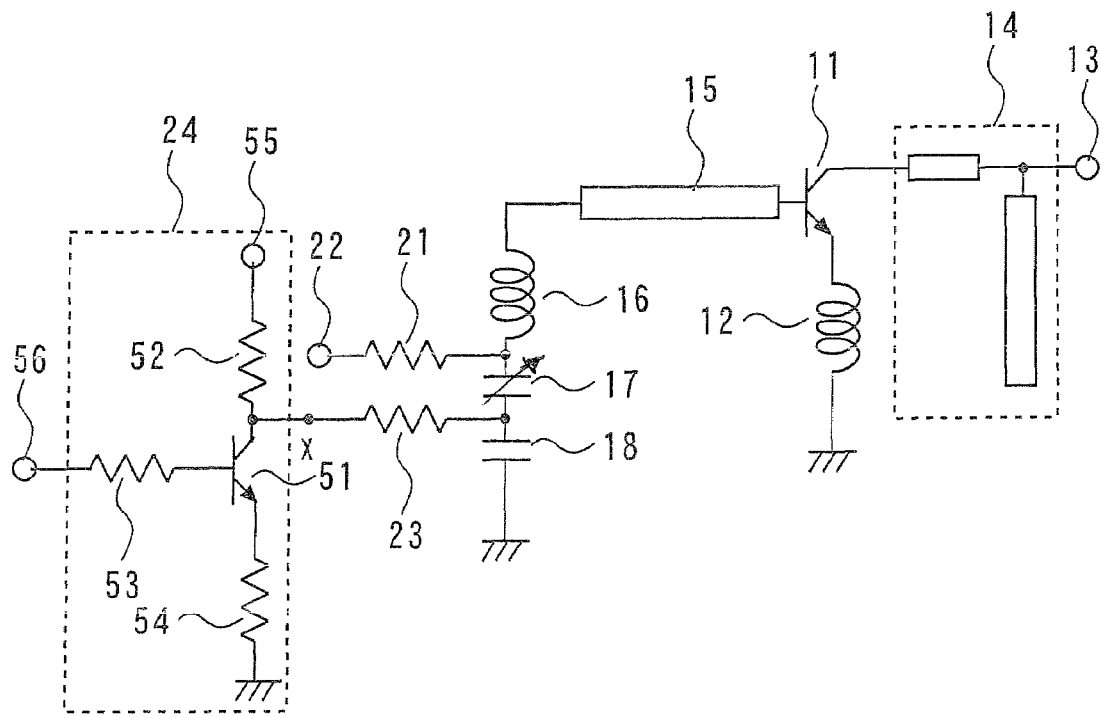
FIG. 16 is a circuit diagram showing another conventional voltage-controlled oscillator.
Figure 17:
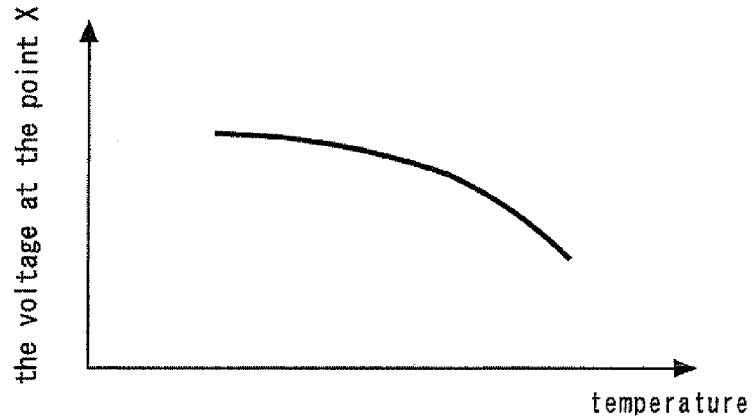
FIG. 17 is a diagram schematically showing a characteristic of the voltage at a point X in FIG. 16 with respect to temperature.
Figure 18:
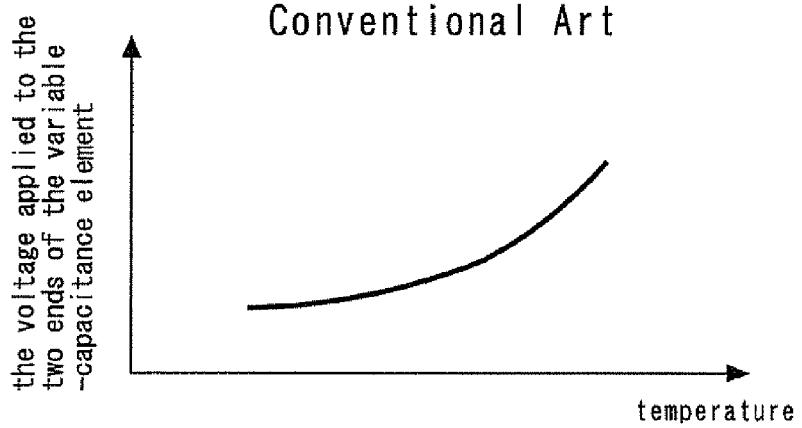
FIG. 18 is a diagram schematically showing a characteristic of the voltage between the two ends of the variable-capacitance element shown in FIG. 16.
Figure 19:
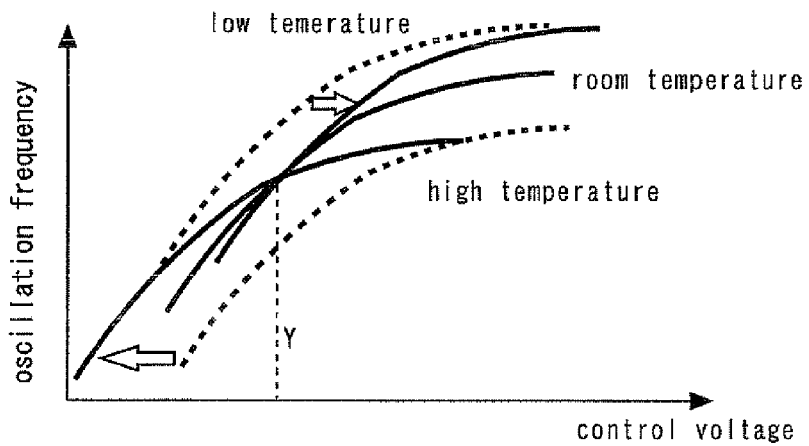
FIG. 19 is a diagram schematically showing oscillation frequency characteristics of the voltage-control oscillator of FIG. 16.

FIG. 13 is a diagram showing the relationship among the oscillation frequency of the voltage-controlled oscillator and the collector current, the current amplification factor and the base resistance of the transistor. When the collector current of the bipolar transistor 11 is increased, the amount of variation in the oscillation frequency with respect to temperature is reduced, as shown in FIG. 13. That is, if the current amplification factor of the bipolar transistor 11 is increased, the amount of variation in the oscillation frequency with respect to temperature is reduced. Ordinarily, if the base layer thickness is increased, the base resistance is reduced and the current amplification factor is reduced. Accordingly, if the base resistance is reduced, the amount of variation in the oscillation frequency with respect to temperature is increased.

On the other hand, if the resistance values of the resistors 31, 35, and 36 are reduced, the base-emitter voltages of the first and second bipolar transistors 33 and 38 are increased. Accordingly, the collector currents of the first and second bipolar transistors 33 and 38 are increased and V and U shown in FIG. 3 become larger. As a result, the change in the temperature compensation voltage output from the temperature compensation bias circuit with respect to temperature becomes larger and, therefore, the amount of temperature compensation of the oscillation frequency also becomes larger. Thus, variation in current amplification factor of the bipolar transistor 11 can be compensated for.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-093698, filed on Mar. 30, 2007 including specification, claims, drawings and summary, on which the Convention priority of the present application is based, are incorporated herein by reference in its entirety.

What is claimed is:

1. A voltage-controlled oscillator in which oscillation frequency is controlled through a voltage applied across first and second ends of a variable-capacitance element, the voltage-controlled oscillator comprising:
   a frequency control bias circuit which applies a voltage for frequency control, in response to a control voltage, to a first end of the variable-capacitance element;
   a first current source which generates a first current in response to the control voltage;
   a second current source which generates a second current in response to temperature, independent of the control voltage;
   a converting resistor having a resistance and which converts a current, obtained by adding together the first and second currents, into a voltage; and
   a temperature compensation bias circuit which applies a voltage for temperature compensation, in response to the voltage produced by the converting resistor, to the second end of the variable-capacitance element.

2. The voltage-controlled oscillator according to claim 1, wherein the resistance of the converting resistor is variable.

3. The voltage-controlled oscillator according to claim 1, wherein
   the first current source includes
      a first resistor having the control voltage applied to a first end of the first resistor,
      a second resistor having a first fixed voltage applied to a first end of the second resistor and having a second end connected to a second end of the first resistor, and
      a first transistor having a base connected to a connection point between the first resistor and the second resistor, a collector connected to the converting resistor, and an emitter to which a second fixed voltage is applied, and
   the second current source includes
      a third resistor having the first fixed voltage applied to a first end of the third resistor,
      a fourth resistor having the second fixed voltage applied to a first end of the fourth resistor and having a second end connected to the second end of the third resistor, and
      a second transistor having a base connected to a connection point between the third resistor and the fourth resistor, a collector connected to the converting resistor, and an emitter to which the second fixed voltage is applied.

4. The voltage-controlled oscillator according to claim 3, wherein one of the first and second fixed voltages is generated in the voltage-controlled oscillator based on the other of the first and second fixed voltages.

5. The voltage-controlled oscillator according to claim 3, wherein the fourth resistor has a resistance that is variable.

6. The voltage-controlled oscillator according to claim 3, wherein each of the first and third resistors is a semiconductor resistor.

* * * * *